(12) United States Patent
Yang

(10) Patent No.: US 12,349,559 B2
(45) Date of Patent: Jul. 1, 2025

(54) THIN FILM TRANSISTOR AND OLED DISPLAY PANEL

(71) Applicant: WUHAN CHINA STAR OPTOELECTRONICS SEMICONDUCTOR DISPLAY TECHNOLOGY CO., LTD., Hubei (CN)

(72) Inventor: Gang Yang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 17/754,246

(22) PCT Filed: Mar. 10, 2022

(86) PCT No.: PCT/CN2022/080192
§ 371 (c)(1),
(2) Date: Mar. 28, 2022

(87) PCT Pub. No.: WO2023/159681
PCT Pub. Date: Aug. 31, 2023

(65) Prior Publication Data
US 2024/0057405 A1  Feb. 15, 2024

(30) Foreign Application Priority Data
Feb. 25, 2022 (CN) .......................... 202210179777.3

(51) Int. Cl.
*H10K 59/12* (2023.01)
*H10K 59/121* (2023.01)
(Continued)

(52) U.S. Cl.
CPC ....... *H10K 59/126* (2023.02); *H10K 59/1201* (2023.02); *H10K 59/1213* (2023.02); *H10K 77/111* (2023.02); *H10K 2102/311* (2023.02)

(58) Field of Classification Search
CPC ......... H10K 2102/311; H10K 59/1213; H10K 59/126; H10K 77/111
See application file for complete search history.

(56) References Cited

U.S. PATENT DOCUMENTS

2006/0255338 A1    11/2006  Jeong et al.
2007/0045556 A1*    3/2007  Watanabe .............. H04N 25/78
                                                  257/E27.141
(Continued)

FOREIGN PATENT DOCUMENTS

CN    101109078 A    1/2008
CN    106653773 A    5/2017
(Continued)

OTHER PUBLICATIONS

Chinese Office Action issued in corresponding Chinese Patent Application No. 202210179777.3 dated Apr. 14, 2024, pp. 1-8.
(Continued)

*Primary Examiner* — Jaehwan Oh
(74) *Attorney, Agent, or Firm* — PV IP PC; Wei Te Chung

(57) ABSTRACT

An embodiment of the present application discloses a thin film transistor, and an OLED display panel. The thin film transistor includes a flexible underlay, a shielding layer, a buffer layer, an active layer, a shielding layer, and a buffer layer disposed between the flexible underlay and the active layer. The buffer layer at least includes a first silicon oxide layer, a dielectric constant of the first silicon oxide layer ranges from 4.04 to 4.1. Increasing the dielectric constant of the first silicon oxide layer lowers a capacitor between a flexible layer and the active layer to mitigate an issue of a
(Continued)

back channel effect generated by charges in a flexible layer to the active layer to ease the issue of lowered brightness and sticky images.

19 Claims, 2 Drawing Sheets

(51) Int. Cl.
*H10K 59/126* (2023.01)
*H10K 77/10* (2023.01)
*H10K 102/00* (2023.01)

(56) References Cited

U.S. PATENT DOCUMENTS

| | | | |
|---|---|---|---|
| 2012/0034451 | A1 | 2/2012 | Seo |
| 2014/0042628 | A1* | 2/2014 | Edelstein .............. H01L 23/52 |
| | | | 438/618 |
| 2018/0175077 | A1* | 6/2018 | Koo .................... H10D 86/60 |
| 2020/0144309 | A1* | 5/2020 | Jeon ................... H10D 86/423 |
| 2021/0104590 | A1* | 4/2021 | Kim .................... H10K 59/126 |
| 2021/0183975 | A1* | 6/2021 | Lee .................... H10K 59/1213 |
| 2022/0352306 | A1* | 11/2022 | Li ........................ H10D 84/83 |
| 2023/0072208 | A1* | 3/2023 | On ..................... H10D 30/6723 |
| 2023/0363223 | A1* | 11/2023 | Zhang ................ H10K 59/1315 |
| 2024/0049529 | A1* | 2/2024 | Yang ................... H10K 59/131 |

FOREIGN PATENT DOCUMENTS

| | | |
|---|---|---|
| CN | 111162090 A | 5/2020 |
| CN | 112786670 A | 5/2021 |
| CN | 113745253 A | 12/2021 |
| JP | H10135467 A | 5/1998 |

OTHER PUBLICATIONS

Chinese Rejection Decision issued in corresponding Chinese Patent Application No. 202210179777.3 dated Jun. 21, 2024, pp. 1-6.
Chinese Office Action issued in corresponding Chinese Patent Application No. 202210179777.3 dated Nov. 8, 2023, pp. 1-12.
International Search Report in International application No. PCT/CN2022/080192, mailed on Nov. 30, 2022.
Written Opinion of the International Search Authority in International application No. PCT/CN2022/080192, mailed on Nov. 30, 2022.
Flat Panel Display Troubleshooting Manual vol. 2 May 31, 2019 Jiao, Feng etc.

* cited by examiner

THIN FILM TRANSISTOR AND OLED DISPLAY PANEL

FIELD OF INVENTION

The present application relates to a field of flexible display technologies, especially to a thin film transistor and an organic light emitting diode (OLED) display panel.

BACKGROUND OF INVENTION

A conventional thin film transistor usually uses flexible polyimide (PI) material as an underlay. During manufacturing processes, when film transistors work, molecules in the flexible underlay PI material are polarized under an electrical field effect such that charges gather in a layer interface, and these charges would reversely affect an active layer to generate a back channel effect to the thin film transistors, which causes lowered brightness and sticky images.

SUMMARY OF INVENTION

Technical Issue

Therefore, the conventional thin film transistor has a technical issue that charges in the flexible PI underlay generate a back channel effect.

Technical Solution

An embodiment of the present application a thin film transistor, an organic light emitting diode (OLED) display panel able to mitigate the technical issue that charges in the flexible PI underlay of a conventional thin film transistor generate a back channel effect.

The embodiment of the present application provides a thin film transistor, including:
- a flexible underlay;
- a shielding layer, the shielding layer disposed on the flexible underlay;
- a buffer layer, the buffer layer disposed on the flexible underlay, the shielding layer, the buffer layer at least includes first silicon oxide layer; and
- an active layer, the active layer disposed on the buffer layer;
- wherein a dielectric constant of the first silicon oxide layer ranges from 4.04 to 4.1.

Optionally, in some embodiments of the present application, a barrier layer is further disposed on the flexible underlay and the shielding layer, the barrier layer at least includes a second silicon oxide layer, a sum of a film layer thickness of the barrier layer and a film layer thickness of the buffer layer is greater than or equal to 11000 Å.

Optionally, in some embodiments of the present application, a film layer thickness of the first silicon oxide layer is greater than or equal to 4000 Å.

Optionally, in some embodiments of the present application, a film layer thickness of the second silicon oxide layer is greater than or equal to 6000 Å.

Optionally, in some embodiments of the present application, a dielectric constant of the second silicon oxide layer ranges from 4.04 to 4.1.

Optionally, in some embodiments of the present application, the dielectric constant of the first silicon oxide layer is the same as the dielectric constant of the second silicon oxide layer.

Optionally, in some embodiments of the present application, at least one silicon nitride layer is disposed between the flexible underlay and the active layer.

Optionally, in some embodiments of the present application, the buffer layer further includes a first silicon nitride layer, the barrier layer further includes a second silicon nitride layer, the second silicon oxide layer is disposed on the shielding layer, the second silicon nitride layer is disposed on the second silicon oxide layer, the first silicon nitride layer is disposed on the second silicon nitride layer, the first silicon oxide layer is disposed on the first silicon nitride layer.

Optionally, in some embodiments of the present application, a thickness of each of the first silicon nitride layer and the second silicon nitride layer is 500 Å.

Optionally, in some embodiments of the present application, a third silicon oxide layer is disposed on the flexible underlay, the shielding layer is disposed on the third silicon oxide layer, and a dielectric constant of the third silicon oxide layer ranges from 4.04 to 4.1.

Optionally, in some embodiments of the present application, the dielectric constant of the third silicon oxide layer is the same as the dielectric constant of each of the first silicon oxide layer and the second silicon oxide layer.

Optionally, in some embodiments of the present application, manufacturing material of the shielding layer is amorphous silicon or metal material.

Optionally, in some embodiments of the present application, an orthographic projection of the shielding layer on the flexible underlay overlaps an orthographic projection of the active layer on the underlay.

Optionally, in some embodiments of the present application, the shielding layer is disposed on an entire surface.

Optionally, in some embodiments of the present application, the shielding layer is disposed in a grid.

Optionally, in some embodiments of the present application, the flexible underlay comprises a first flexible underlay layer, a rigid underlay layer disposed on the first flexible underlay layer, and a second flexible underlay layer 103 disposed on the rigid underlay layer.

Optionally, in some embodiments of the present application, an end of the shielding layer contacts the second flexible underlay layer, and another end of the shielding layer is grounded.

Optionally, in some embodiments of the present application, a compensation film layer is further disposed between the flexible underlay and the active layer, and the compensation film layer is configured to increase a distance between the flexible underlay 10 and the active layer.

Optionally, in some embodiments of the present application, material for manufacturing the compensation film layer is silicon nitride or silicon oxide.

The embodiment of the present application provides an OLED display panel, including the thin film transistor of any one of the above embodiments.

Advantages

Increasing a dielectric constant of the first silicon oxide layer lowers a capacitor between the flexible layer and the active layer to mitigate an issue of a back channel effect generated by charges in a flexible layer to the active layer.

DESCRIPTION OF DRAWINGS

To more clearly elaborate on the technical solutions of embodiments of the present invention or prior art, appended figures necessary for describing the embodiments of the present invention or prior art will be briefly introduced as follows. Apparently, the following appended figures are merely some embodiments of the present invention. A person of ordinary skill in the art may acquire other figures according to the appended figures without any creative effort.

REFERENCE NUMERAL INDICATION

Figure 1:
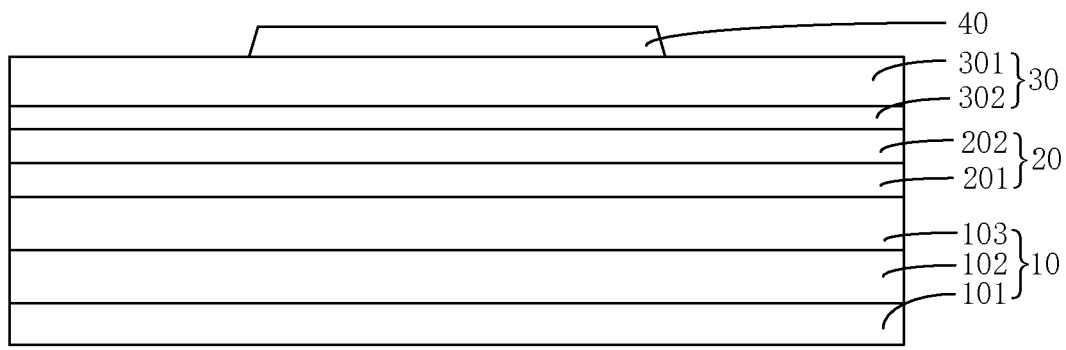
FIG. 1 is a first cross-sectional schematic view of a thin film transistor provided by the present application.

| reference numeral | element name | reference numeral | element name |
|---|---|---|---|
| 10 | flexible underlay | 20 | barrier layer |
| 30 | buffer layer | 40 | active layer |
| 50 | shielding layer | 60 | third silicon oxide layer |
| 101 | first flexible underlay layer | 102 | rigid underlay layer |
| 103 | second flexible underlay layer | 201 | second silicon oxide layer |
| 202 | second silicon nitride layer | 301 | first silicon oxide layer |
| 302 | first silicon nitride layer | | |

DETAILED DESCRIPTION OF PREFERRED EMBODIMENTS

The technical solution in the embodiment of the present application will be clearly and completely described below with reference to the accompanying drawings in the embodiments of the present application. Apparently, the described embodiments are merely some embodiments of the present application instead of all embodiments. According to the embodiments in the present application, all other embodiments obtained by those skilled in the art without making any creative effort shall fall within the protection scope of the present application. In addition, it should be understood that the specific embodiments described here are only used to illustrate and explain the present application, and are not used to limit the present application. In the present application, the used orientation terminologies such as "upper" and "lower", when are not specified to the contrary explanation, usually refer to the upper and lower states of the device in actual use or working conditions, specifically according to the direction of the figures in the drawings. Furthermore, "inner" and "outer" refer to the outline of the device.

In a conventional thin film transistor, when the thin film transistor works, molecules in flexible underlay PI material are affected by an electrical field and polarized such that charges gather in a layer interface and these charges reversely affect the active layer to influence reliability of the thin film transistor.

Therefore, it is urgent to require a thin film transistor able to mitigate a technical issue of a back channel effect generated by charges in a flexible PI underlay of a conventional thin film transistor.

Figure 2:
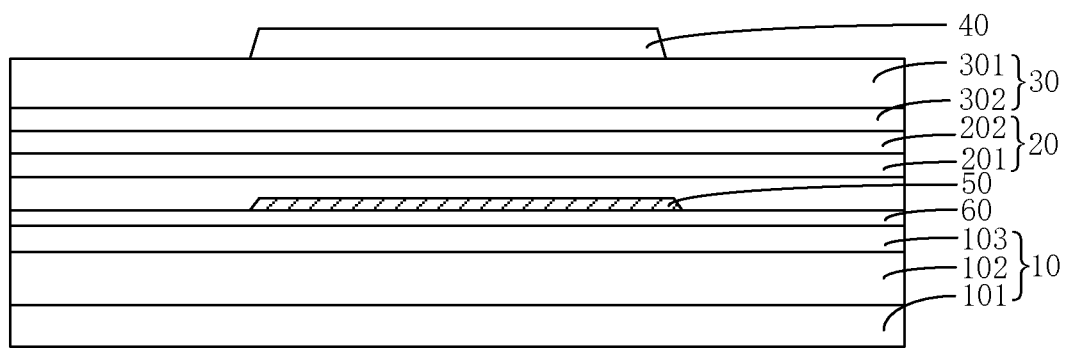
FIG. 2 is a second cross-sectional schematic view of the thin film transistor provided by the present application.
Figure 3:
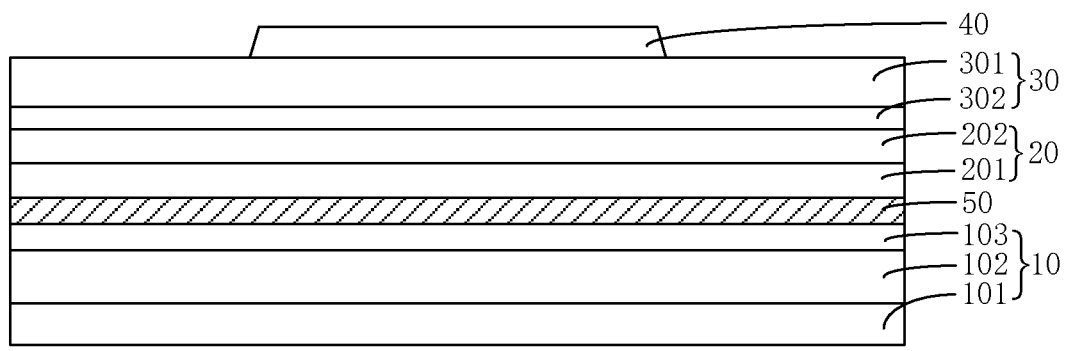
FIG. 3 is a third cross-sectional schematic view of the thin film transistor provided by the present application.

With reference to FIGS. 1 to 3, a thin film transistor provided by the present application includes a flexible underlay 10, a shielding layer 50, a buffer layer 30, and an active layer 40. The shielding layer 50 is disposed on the flexible underlay 10, the buffer layer 30 is disposed on the flexible underlay 10, the shielding layer 50. The buffer layer 30 at least includes first silicon oxide layer 301, the active layer 40 is disposed on the buffer layer 30, wherein a dielectric constant of the first silicon oxide layer 301 ranges from 4.04 to 4.1. Increasing the dielectric constant of the first silicon oxide layer 301 lowers a capacitor between the flexible layer and the active layer 40 to mitigate the back channel effect of charges in the flexible layer to the active layer 40, which eases the issue of lowered brightness and sticky images.

The thin film transistor further includes a gate insulation layer disposed on the active layer 40, a gate electrode, an interlayer insulation layer, a source electrode, and a drain electrode.

The flexible underlay 10 includes a first flexible underlay layer 101, a rigid underlay layer 102 disposed on the first flexible underlay layer 101, and a second flexible underlay layer 103 disposed on the rigid underlay layer 102.

The flexible underlay 10 has gathering charges, the charges give a back channel effect to the active layer 40. A value of a capacitor between the charges of the flexible underlay 10 and the active layer 40 is in proportion to the back channel effect.

In particular, the greater the capacitor is, the greater the influence of the charges to the active layer 40 is. The stronger the back channel effect is, the smaller the capacitor is. The smaller influence of the charges to the active layer 40 is, the weaker the back channel effect is.

In particular, a determination equation of the capacitor is: $C=\varepsilon S/4\pi kd$; wherein, $\varepsilon$ refers to a dielectric constant between the flexible underlay 10 and the active layer 40, S refers to a right facing area between the flexible underlay 10 and the active layer 40, d refers to a distance between the flexible underlay 10 and the active layer 40, and k refers to an electrostatic force constant.

It can be understood that lowering the capacitor reduces influence of the back channel effect. the capacitor is in proportion to the dielectric constant and the right facing area, and is in reverse proportion to the distance.

It should be noted that in the back channel effect generated by charges in the flexible underlay 10 to the active layer 40, a value of a capacitor between the flexible underlay 10 and the active layer 40 is for evaluating an intensity of influence of charges the active layer 40. Therefore, the value of the capacitor directly determines the intensity of the back channel effect. Lowering the capacitor improves stability of the thin film transistor.

Specific embodiments are combined to describe technical solutions of the present application.

The following embodiment employs, improvements in three aspect, the dielectric constant between the flexible underlay 10 and the active layer 40, the right facing area between the flexible underlay 10 and the active layer 40, the distance between the flexible underlay 10 and the active layer 40 to achieve the effect of lowering the capacitor between the flexible underlay 10 and the active layer 40 to further ease the back channel effect generated by the charges in the flexible layer to the active layer 40, which mitigates the issue of lowered brightness and sticky images in the display panel.

With reference to FIG. 1, in some embodiments, lowering a dielectric constant of a film layer between the flexible underlay 10 and the active layer 40 reduces a capacitor between the flexible underlay 10 and the active layer 40 to mitigate a back channel effect generated by charges in the flexible layer to the active layer 40.

In an embodiment, the flexible underlay 10, a barrier layer 20 is disposed on the flexible underlay 10 and the shielding layer 50. The barrier layer 20 at least includes a second silicon oxide layer 201. A dielectric constant of the second silicon oxide layer 201 ranges from 4.04 to 4.1.

The buffer layer 30 is disposed on the barrier layer 20.

The dielectric constant of the first silicon oxide layer 301 can be the same as the dielectric constant of the second silicon oxide layer 201.

It can be understood that using the same ratio of nitrous oxide gas to silicon nitride gas to respectively manufacture and obtain the first silicon oxide layer 301 and the second silicon oxide layer 201 can simplify manufacturing processes and lower a cost.

It should be noted that, a dielectric constant of a conventional silicon oxide layer is greater than 4.1, while the dielectric constant of the silicon oxide layer provided by the present application can be less than 4.1. Changing the ratio of nitrous oxide gas and silicon nitride gas injected can achieve the dielectric constant of the silicon oxide layer less than 4.1.

In the present embodiment, a second silicon oxide layer 201 is further disposed between the flexible underlay 10 and the active layer 40. Lowering the dielectric constant of the second silicon oxide layer 201 mitigates the back channel effect generated by charges in the flexible layer to the active layer 40.

With reference to FIG. 2, in an embodiment, a third silicon oxide layer 60 is further disposed on the flexible underlay 10. The shielding layer 50 is disposed on the third silicon oxide layer 60. A dielectric constant of the third silicon oxide layer 60 ranges from 4.04 to 4.1.

In particular, the dielectric constant of the third silicon oxide layer 60 can be the same as the dielectric constant of the first silicon oxide layer 301 and the dielectric constant of the second silicon oxide layer 201.

It can be understood that changing of the dielectric constant of the third silicon oxide layer 60 is also implemented by changing the ratio of nitrous oxide gas and silicon nitride gas injected during manufacturing, which can particularly refer to at least one of the first silicon oxide layer 301 and the second silicon oxide layer 201 and would not described repeatedly here.

It should be noted that the third silicon oxide layer 60 is disposed under the shielding layer 50 and can serve as a sacrifice layer. During patterning a metal layer or amorphous silicon layer by etching to form the shielding layer 50, the sacrifice layer is configured to prevent over etching of the lower first flexible underlay layer 101.

With reference to FIGS. 1 and 2, in an embodiment, in the display panel, at least one layer silicon nitride layer is disposed between the flexible underlay 10 and the active layer 40.

The buffer layer 30 further includes a first silicon nitride layer 302, the barrier layer 20 further includes a second silicon nitride layer 202.

In the present embodiment, the dielectric constant of the at least one silicon nitride layer can be lowered to reduce a capacitor between charges in the flexible underlay 10 and the active layer 40 to further mitigate the back channel effect generated by the charges in the flexible layer to the active layer 40 and mitigate the issue of lowered brightness and sticky images.

In some embodiments, increasing a distance between the flexible underlay 10 and the active layer 40 can mitigate the back channel effect generated by the charges in the flexible underlay 10 to the active layer 40.

The distance between the flexible underlay 10 and the active layer 40 cab be increased by raising a thickness of each film layer between the flexible underlay 10 and the active layer 40.

In an embodiment, a barrier layer 20 is further disposed on the flexible underlay 10 and the shielding layer 50. The barrier layer 20 at least includes a second silicon oxide layer 201. A sum of a film layer thickness of the barrier layer 20 and a film layer thickness of the buffer layer 30 is greater than or equal to 11000 Å.

In particular, a film layer thickness of the first silicon oxide layer 301 is 4000 Å, a film layer thickness of the second silicon oxide layer 201 is 6000 Å, a thickness of each of the first silicon nitride layer 302 and the second silicon nitride layer 202 is 500 Å. In the meantime, a thickness between the flexible underlay 10 and the active layer 40 is greater than or equal to 11000 Å.

In an embodiment, the film layer thickness of the first silicon oxide layer 301 is greater than or equal to 4000 Å.

In the present embodiment, changing the thickness of the first silicon oxide layer 301 increases the distance between the flexible underlay 10 and the active layer 40.

In an embodiment, the film layer thickness of the second silicon oxide layer 201 is greater than or equal to 6000 Å.

In the present embodiment, changes the thickness of the second silicon oxide layer 201 increases the distance between the flexible underlay 10 and the active layer 40.

In an embodiment, a compensation film layer is further disposed between the flexible underlay 10 and the active layer 40. The compensation film layer is configured to increase a distance between the flexible underlay 10 and the active layer 40.

Material for manufacturing the compensation film layer is silicon nitride or silicon oxide.

The compensation film layer is the third silicon oxide layer 60. Increasing a thickness of the third silicon oxide layer 60 increases the distance between the flexible underlay 10 and the active layer 40.

With reference to FIGS. 2 and 3, in some embodiments, the shielding layer 50 is disposed on the second flexible underlay layer 103. The shielding layer 50 is configured to conduct charges out from the second flexible underlay layer 103 such that the gathering charges are dispersed everywhere of the shielding layer 50.

The shielding layer 50 can be disposed on an entire surface or disposed in a grid.

When the shielding layer 50 is disposed in a grid, adjacent patterns of the shielding layer 50 are connected.

In the present embodiment, the shielding layer 50 makes some of gathering charges dispersed to reduce a right facing area between the flexible underlay 10 and the active layer 40. It should be noted that the right facing area is a right facing effective area between charges and active layer 40.

In an embodiment, material for manufacturing the shielding layer 50 is amorphous silicon or metal material.

It should be noted that material for manufacturing the shielding layer 50 is not limited to amorphous silicon or metal material, and further includes other conductor material or semiconductor material has a conductivity better than that of amorphous silicon.

In the present embodiment, a conductor or semiconductor material with better conductivity is used to manufacture and obtain the shielding layer 50, and the gathering charges are dispersed by contact of the shielding layer 50 with the second flexible underlay layer 103 such that a capacitor between the gathering charges and the active layer 40 is lowered.

In an embodiment, an orthographic projection of the shielding layer 50 on the flexible underlay 10 overlaps an orthographic projection of the active layer 40 on the underlay.

In an embodiment, an end of the shielding layer 50 contacts the second flexible underlay layer 103, and another end of the shielding layer 50 is grounded.

It can be understood that the shielding layer 50 conducts charges out from the flexible underlay 10 to reduce the capacitor between the shielding layer 50 and the flexible underlay 10 to further lower influence and a back channel effect of the charges to the active layer 40.

Figure 4:
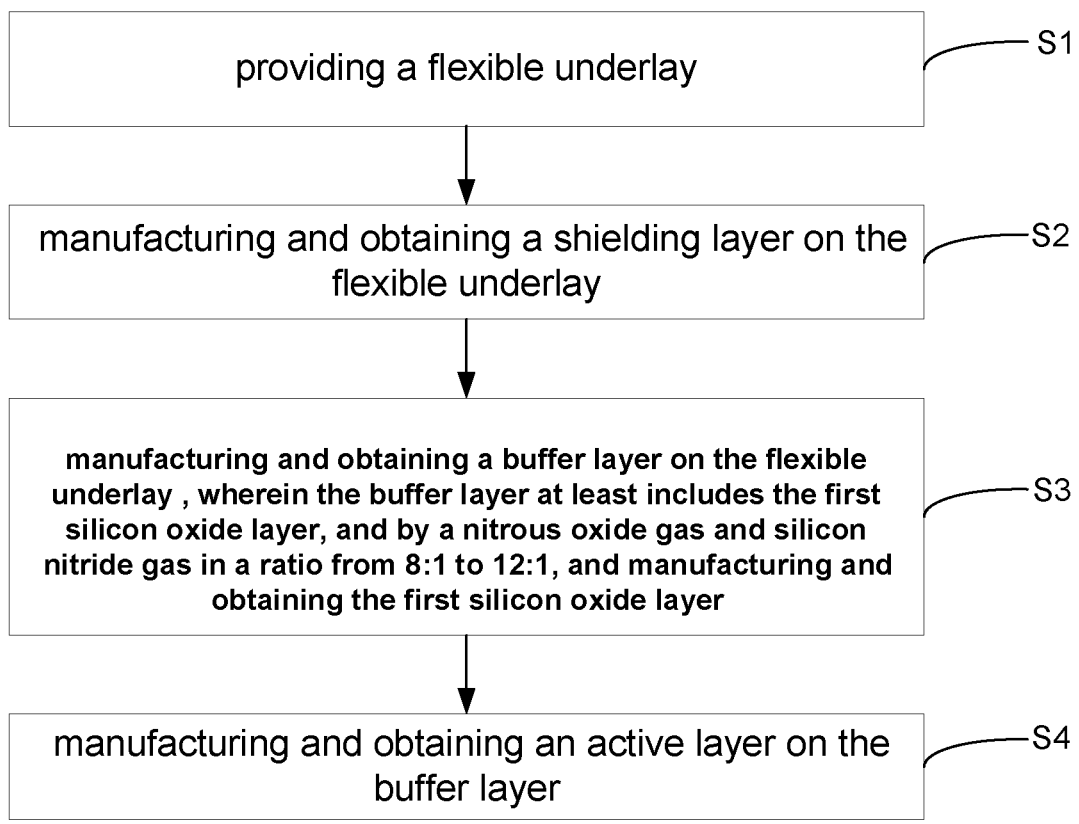
FIG. 4 is a schematic flow chart of a thin film transistor manufacturing method provided by the present application.

With reference to FIG. 4, the embodiment of the present application provides a thin film transistor manufacturing method, includes:
S1: providing a flexible underlay 10;
S2: manufacturing and obtaining a shielding layer 50 on the flexible underlay 10;
S3: manufacturing and obtaining a buffer layer 30 on the flexible underlay 10, wherein the buffer layer 30 at least includes the first silicon oxide layer 301, and by a nitrous oxide gas and silicon nitride gas in a ratio from 8:1 to 12:1, and manufacturing and obtaining the first silicon oxide layer 301;
S4: manufacturing and obtaining an active layer 40 on the buffer layer 30.

The dielectric constant of the manufactured and obtained first silicon oxide layer 301 ranges from 4.04 to 4.1.

According to an experiment, when a flow ratio of nitrous oxide gas to silicon nitride gas is 14:1, a dielectric constant of the manufactured and obtained silicon oxide layer is 4.13. Furthermore, by nitrous oxide gas and silicon nitride gas in a flow ratio of 12:1, a dielectric constant of the manufactured and obtained silicon oxide layer is 4.1. By nitrous oxide gas and silicon nitride gas of a flow ratio of 8:1, a dielectric constant of the manufactured and obtained silicon oxide layer is 4.04. Therefore, it is inspired to obtain: lowering a flow ratio of nitrous oxide gas to silicon nitride gas reduces a dielectric constant of the manufactured and obtained silicon oxide layer.

Therefore, under a prerequisite of available manufacturing processes, further lowering the flow ratio of nitrous oxide gas to silicon nitride gas can also make the dielectric constant of the silicon oxide layer less than 4.04. It can be understood that the above solution is not limited to nitrous oxide gas and silicon nitride gas, any reacting gas with similar characteristics for reacting and obtaining silicon oxide layer are contained in the present embodiment.

The embodiment of the present application provides an OLED display panel including the thin film transistor of any one of the above embodiments.

In particular, the OLED display panel includes a thin film transistor. The thin film transistor includes a flexible underlay 10, a shielding layer 50, a buffer layer 30, and an active layer 40. The shielding layer 50 is disposed on the flexible underlay 10, the buffer layer 30 is disposed on the flexible underlay 10, the shielding layer 50, the buffer layer 30 at least includes first silicon oxide layer 301, the active layer 40 is disposed on the buffer layer 30. A dielectric constant of the first silicon oxide layer 301 ranges from 4.04 to 4.1.

In some embodiments, in the display panel, lowering a dielectric constant of a film layer between the flexible underlay 10 and the active layer 40 reduces a capacitor between the flexible underlay 10 and the active layer 40 to mitigate a back channel effect generated by charges in the flexible layer to the active layer 40.

In an embodiment, in the display panel, a barrier layer 20 is disposed on the flexible underlay 10 and the shielding layer 50. The barrier layer 20 at least includes a second silicon oxide layer 201. A dielectric constant of the second silicon oxide layer 201 ranges from 4.04 to 4.1.

The buffer layer 30 is disposed on the barrier layer 20.

The dielectric constant of the first silicon oxide layer 301 can be the same as the dielectric constant of the second silicon oxide layer 201.

It can be understood that using the same ratio of nitrous oxide gas to silicon nitride gas to respectively manufacture and obtain the first silicon oxide layer 301 and the second silicon oxide layer 201 can simplify manufacturing processes and lower a cost.

It should be noted that, a dielectric constant of a conventional silicon oxide layer is greater than 4.1, while the dielectric constant of the silicon oxide layer provided by the present application can be less than 4.1. Changing the ratio of nitrous oxide gas and silicon nitride gas injected can achieve the dielectric constant of the silicon oxide layer less than 4.1.

In the present embodiment, a second silicon oxide layer 201 is further disposed between the flexible underlay 10 and the active layer 40. Lowering the dielectric constant of the second silicon oxide layer 201 mitigates the back channel effect generated by charges in the flexible layer to the active layer 40.

With reference to FIG. 2, in an embodiment, a third silicon oxide layer 60 is further disposed on the flexible underlay 10. The shielding layer 50 is disposed on the third silicon oxide layer 60. A dielectric constant of the third silicon oxide layer 60 ranges from 4.04 to 4.1.

In particular, the dielectric constant of the third silicon oxide layer 60 can be the same as the dielectric constant of the first silicon oxide layer 301 and the dielectric constant of the second silicon oxide layer 201.

It can be understood that changing of the dielectric constant of the third silicon oxide layer 60 is also implemented by changing the ratio of nitrous oxide gas and silicon nitride gas injected during manufacturing, which can particularly refer to at least one of the first silicon oxide layer 301 and the second silicon oxide layer 201 and would not described repeatedly here.

It should be noted that the third silicon oxide layer 60 is disposed under the shielding layer 50 and can serve as a sacrifice layer. During patterning a metal layer or amorphous silicon layer by etching to form the shielding layer 50, the sacrifice layer is configured to prevent over etching of the lower first flexible underlay layer 101.

With reference to FIGS. 1 and 2, in an embodiment, in the display panel, at least one layer silicon nitride layer is disposed between the flexible underlay 10 and the active layer 40.

The buffer layer 30 further includes a first silicon nitride layer 302, the barrier layer 20 further includes a second silicon nitride layer 202.

In the present embodiment, the dielectric constant of the at least one silicon nitride layer can be lowered to reduce a capacitor between charges in the flexible underlay 10 and the active layer 40 to further mitigate the back channel effect generated by the charges in the flexible layer to the active layer 40 and mitigate the issue of lowered brightness and sticky images.

In some embodiments, increasing a distance between the flexible underlay 10 and the active layer 40 can mitigate the back channel effect generated by the charges in the flexible underlay 10 to the active layer 40.

The distance between the flexible underlay 10 and the active layer 40 cab be increased by raising a thickness of each film layer between the flexible underlay 10 and the active layer 40.

In an embodiment, in the display panel, a barrier layer 20 is further disposed on the flexible underlay 10 and the shielding layer 50. The barrier layer 20 at least includes a second silicon oxide layer 201. A sum of a film layer thickness of the barrier layer 20 and a film layer thickness of the buffer layer 30 is greater than or equal to 11000 Å.

In particular, a film layer thickness of the first silicon oxide layer 301 is 4000 Å, a film layer thickness of the second silicon oxide layer 201 is 6000 Å, a thickness of each of the first silicon nitride layer 302 and the second silicon nitride layer 202 is 500 Å. In the meantime, a thickness between the flexible underlay 10 and the active layer 40 is greater than or equal to 11000 Å.

In an embodiment, the film layer thickness of the first silicon oxide layer 301 is greater than or equal to 4000 Å.

In the present embodiment, changing the thickness of the first silicon oxide layer 301 increases the distance between the flexible underlay 10 and the active layer 40.

In an embodiment, the film layer thickness of the second silicon oxide layer 201 is greater than or equal to 6000 Å.

In the present embodiment, changes the thickness of the second silicon oxide layer 201 increases the distance between the flexible underlay 10 and the active layer 40.

In an embodiment, a compensation film layer is further disposed between the flexible underlay 10 and the active layer 40. The compensation film layer is configured to increase a distance between the flexible underlay 10 and the active layer 40.

Material for manufacturing the compensation film layer is silicon nitride or silicon oxide.

The compensation film layer is the third silicon oxide layer 60. Increasing a thickness of the third silicon oxide layer 60 increases the distance between the flexible underlay 10 and the active layer 40.

With reference to FIGS. 2 and 3, in some embodiments, in the display panel, the shielding layer 50 is disposed on the second flexible underlay layer 103. The shielding layer 50 is configured to conduct charges out from the second flexible underlay layer 103 such that the gathering charges are dispersed everywhere of the shielding layer 50.

The shielding layer 50 can be disposed on an entire surface or disposed in a grid.

When the shielding layer 50 is disposed in a grid, adjacent patterns of the shielding layer 50 are connected.

In the present embodiment, the shielding layer 50 makes some of gathering charges dispersed to reduce a right facing area between the flexible underlay 10 and the active layer 40. It should be noted that the right facing area is a right facing effective area between charges and active layer 40.

In an embodiment, material for manufacturing the shielding layer 50 is amorphous silicon or metal material.

It should be noted that material for manufacturing the shielding layer 50 is not limited to amorphous silicon or metal material, and further includes other conductor material or semiconductor material has a conductivity better than that of amorphous silicon.

In the present embodiment, a conductor or semiconductor material with better conductivity is used to manufacture and obtain the shielding layer 50, and the gathering charges are dispersed by contact of the shielding layer 50 with the second flexible underlay layer 103 such that a capacitor between the gathering charges and the active layer 40 is lowered.

In an embodiment, in the display panel, an orthographic projection of the shielding layer 50 on the flexible underlay 10 overlaps an orthographic projection of the active layer 40 on the underlay.

In an embodiment, in the display panel, an end of the shielding layer 50 contacts the second flexible underlay layer 103, an another end is grounded.

It can be understood that the shielding layer 50 conducts charges out from the flexible underlay 10 to reduce the capacitor between the shielding layer 50 and the flexible underlay 10 to further lower influence and a back channel effect of the charges to the active layer 40.

The present application also provides a display module, a display device, a terminal apparatus. The display module, the display device, and the terminal apparatus all include the above thin film transistor and would not be described repeatedly here.

The thin film transistor provided by the embodiment of the present application includes a flexible underlay, a shielding layer, a buffer layer, an active layer, the shielding layer is disposed on the flexible underlay, the buffer layer is disposed on the flexible underlay, the shielding layer, the buffer layer at least includes first silicon oxide layer, the active layer is disposed on the buffer layer, wherein a dielectric constant of the first silicon oxide layer ranges from 4.04 to 4.1. Increasing a dielectric constant of the first silicon oxide layer lowers a capacitor between the flexible layer and the active layer to mitigate an issue of a back channel effect generated by charges in a flexible layer to the active layer to ease the issue of lowered brightness and sticky image.

In the above-mentioned embodiments, the descriptions of the various embodiments are focused. For the details of the embodiments not described, reference may be made to the related descriptions of the other embodiments.

The thin film transistor, the OLED display panel provided by the embodiment of the present application are described in detail as above. In the specification, the specific examples are used to explain the principle and embodiment of the present application. The above description of the embodiments is only used to help understand the method of the present application and its spiritual idea. Meanwhile, for those skilled in the art, according to the present idea of invention, changes will be made in specific embodiment and application. In summary, the contents of this specification should not be construed as limiting the present application.

What is claimed is:
1. A thin film transistor, comprising:
a flexible underlay;
a shielding layer, the shielding layer disposed on the flexible underlay;
a buffer layer, the buffer layer disposed on the flexible underlay, the shielding layer, the buffer layer at least comprises a first silicon oxide layer; and
an active layer, the active layer disposed on the buffer layer;
wherein a dielectric constant of the first silicon oxide layer ranges from 4.04 to 4.1;
wherein a barrier layer is further disposed on the flexible underlay and the shielding layer, the barrier layer at least comprises a second silicon oxide layer, and a sum of a film layer thickness of the barrier layer and a film layer thickness of the buffer layer is greater than or equal to 11000 Å.

2. The thin film transistor according to claim 1, wherein a film layer thickness of the first silicon oxide layer is greater than or equal to 4000 Å.

3. The thin film transistor according to claim 1, wherein a film layer thickness of the second silicon oxide layer is greater than or equal to 6000 Å.

4. The thin film transistor according to claim 1, wherein a dielectric constant of the second silicon oxide layer ranges from 4.04 to 4.1.

5. The thin film transistor according to claim 4, wherein the dielectric constant of the first silicon oxide layer is the same as the dielectric constant of the second silicon oxide layer.

6. The thin film transistor according to claim 1, wherein at least one silicon nitride layer is disposed between the flexible underlay and the active layer.

7. The thin film transistor according to claim 6, wherein the buffer layer further comprises a first silicon nitride layer, the barrier layer further comprises a second silicon nitride layer, the second silicon oxide layer is disposed on the shielding layer, the second silicon nitride layer is disposed on the second silicon oxide layer, the first silicon nitride layer is disposed on the second silicon nitride layer, the first silicon oxide layer is disposed on the first silicon nitride layer.

8. The thin film transistor according to claim 7, wherein a thickness of each of the first silicon nitride layer and the second silicon nitride layer is 500 Å.

9. The thin film transistor according to claim 1, wherein a third silicon oxide layer is disposed on the flexible underlay, the shielding layer is disposed on the third silicon oxide layer, and a dielectric constant of the third silicon oxide layer ranges from 4.04 to 4.1.

10. The thin film transistor according to claim 9, wherein the dielectric constant of the third silicon oxide layer is the same as the dielectric constant of each of the first silicon oxide layer and the second silicon oxide layer.

11. The thin film transistor according to claim 1, wherein manufacturing material of the shielding layer is amorphous silicon or metal material.

12. The thin film transistor according to claim 1, wherein an orthographic projection of the shielding layer on the flexible underlay overlaps an orthographic projection of the active layer on the underlay.

13. The thin film transistor according to claim 1, wherein the shielding layer is disposed on an entire surface.

14. The thin film transistor according to claim 1, wherein the shielding layer is disposed in a grid.

15. The thin film transistor according to claim 1, wherein the flexible underlay comprises a first flexible underlay layer, a rigid underlay layer disposed on the first flexible underlay layer, and a second flexible underlay layer 103 disposed on the rigid underlay layer.

16. The thin film transistor according to claim 15, wherein an end of the shielding layer contacts the second flexible underlay layer, and another end of the shielding layer is grounded.

17. The thin film transistor according to claim 1, wherein a compensation film layer is further disposed between the flexible underlay and the active layer, and the compensation film layer is configured to increase a distance between the flexible underlay 10 and the active layer.

18. The thin film transistor according to claim 17, wherein material for manufacturing the compensation film layer is silicon nitride or silicon oxide.

19. An organic light emitting diode (OLED) display panel, comprising the thin film transistor according to claim 1.

* * * * *